United States Patent
Song et al.

(10) Patent No.: US 11,545,787 B2
(45) Date of Patent: Jan. 3, 2023

(54) BACKPLANE CONNECTOR WITH IMPROVED SHIELDING EFFECT

(71) Applicant: Dongguan Luxshare Technologies Co., Ltd, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 99 days.

(21) Appl. No.: 17/333,968

(22) Filed: May 28, 2021

(65) Prior Publication Data
US 2021/0399490 A1    Dec. 23, 2021

(30) Foreign Application Priority Data

Jun. 19, 2020  (CN) .......................... 202010567796.4
Jul. 22, 2020  (CN) .......................... 202010709180.6

(51) Int. Cl.
*H01R 9/03*       (2006.01)
*H01R 13/6471*  (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CN | 1244959 A | 2/2000 |
| CN | 2513252 Y | 9/2002 |

(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of conductive terminals, an insulating frame, a first metal shield and a second metal shield. The first metal shield and the second metal shield respectively include a first extension portion and a second extension portion. The conductive terminals include differential signal terminals, a first ground terminal and a second ground terminal. The first extension portion and the second extension portion in contact with the first ground terminal and the second ground terminal. As a result, a shielding space to enclose contact portions of the differential signal terminals is formed. This arrangement can provide better shielding for the differential signal terminals, reduce crosstalk, and improve the quality of signal transmission.

10 Claims, 16 Drawing Sheets

(51) Int. Cl.

| | | |
|---|---|---|
| *H01R 13/40* | (2006.01) | |
| *H01R 13/6587* | (2011.01) | |
| *H01R 13/6591* | (2011.01) | |
| *H01R 13/514* | (2006.01) | |
| *H01R 13/518* | (2006.01) | |
| *H01R 12/72* | (2011.01) | |
| *H01R 13/6586* | (2011.01) | |
| *H01R 12/58* | (2011.01) | |
| *H05K 1/11* | (2006.01) | |
| *H01R 13/6588* | (2011.01) | |
| *H01R 13/6583* | (2011.01) | |
| *H01R 13/6585* | (2011.01) | |
| *H01R 13/6582* | (2011.01) | |
| *H01R 43/24* | (2006.01) | |
| *H01R 12/71* | (2011.01) | |
| *H01R 13/20* | (2006.01) | |
| *H01R 13/504* | (2006.01) | |
| *H01R 13/6461* | (2011.01) | |
| *H01R 13/6584* | (2011.01) | |
| *H01R 13/6474* | (2011.01) | |

(52) U.S. Cl.
 CPC ........... *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
 CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
 USPC .................................. 439/108, 701, 607.08
 See application file for complete search history.

(56) References Cited

U.S. PATENT DOCUMENTS

| | | |
|---|---|---|
| 9,350,126 B2 | 5/2016 | Little et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 105470679 A | 4/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | 201733225 A | 9/2017 |
| TW | I600231 B | 9/2017 |
| TW | I623154 B | 5/2018 |
| TW | 201841440 A | 11/2018 |

(56) References Cited

FOREIGN PATENT DOCUMENTS

| | | |
|---|---|---|
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

BACKPLANE CONNECTOR WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202010709180.6, filed on Jul. 22, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connectors usually include an insulating housing and a plurality of terminal modules assembled to the insulating housing. Each terminal module includes an insulating frame, a plurality of conductive terminals insert-molded with the insulating frame, and a metal shield mounted to at least one side of the insulating frame. The conductive terminals usually include multiple pairs of differential signal terminals, a first ground terminal located on one side of each pair of differential signal terminals, and a second ground terminal located on the other side of each pair of differential signal terminals. The first ground terminal, the second ground terminal and the metal shield provide shielding for the differential signal terminals in order to reduce signal crosstalk and improve the quality of signal transmission.

However, with the continuous improvement of the signal transmission requirements of high-speed connectors, there is still room for improvement in the shielding of the differential signal terminals of the existing backplane connectors.

SUMMARY

An object of the present disclosure is to provide a backplane connector with improved shielding effect.

In order to achieve the above object, the present disclosure adopts the following technical solution: a backplane connector, comprising a wafer, the wafer comprising: a plurality of conductive terminals, each conductive terminal comprising a connection portion and a contact portion; an insulating frame fixed with the connection portions of the conductive terminals; a first metal shield comprising a first extension portion located on one side of the contact portions of the conductive terminals; and a second metal shield comprising a second extension portion located on the other opposite side of the contact portions of the conductive terminals; wherein the conductive terminals comprise differential signal terminals, a first ground terminal and a second ground terminal, and the differential signal terminals are located between the first ground terminal and the second ground terminal; wherein the first extension portion comprises a first bulge protruding toward the first ground terminal and a second bulge protruding toward the second ground terminal; wherein the second extension portion comprises a third bulge protruding toward the first ground terminal and a fourth bulge protruding toward the second ground terminal; and wherein the first bulge and the third bulge are in contact with two opposite side surfaces of the contact portion of the first ground terminal, respectively; the second bulge and the fourth bulge are in contact two opposite side surfaces of the contact portion of the second ground terminal, respectively; and the first extension portion, the second extension portion, the first ground terminal and the second ground terminal jointly form a shielding space which encloses the contact portions of the differential signal terminals.

Compared with the prior art, the first extension portion, the second extension portion, the first ground terminal and the second ground terminal of the present disclosure jointly form a shielding space enclosing the contact portions of the differential signal terminals. As a result, the shielding space is capable of providing better shielding for the differential signal terminals along the length of the contact portions of the differential signal terminals, reducing crosstalk, and improving the quality of signal transmission.

DETAILED DESCRIPTION

Figure 1:
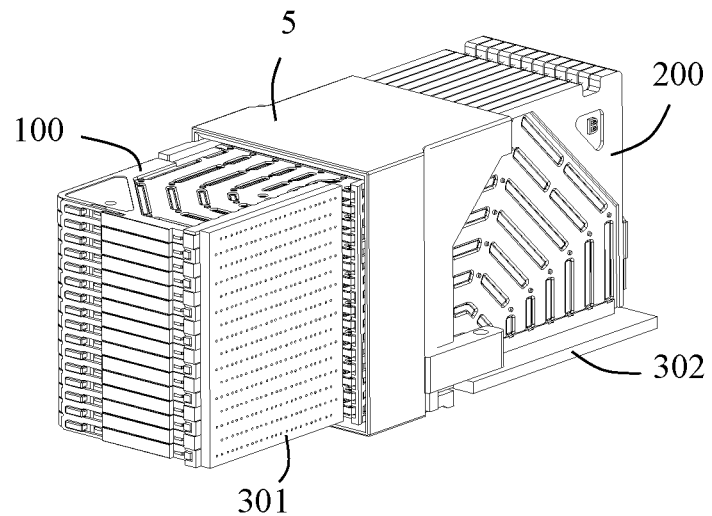
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
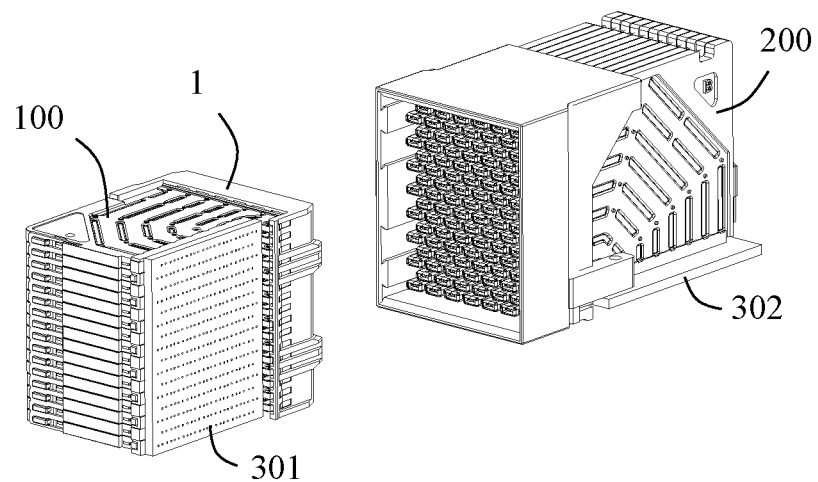
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
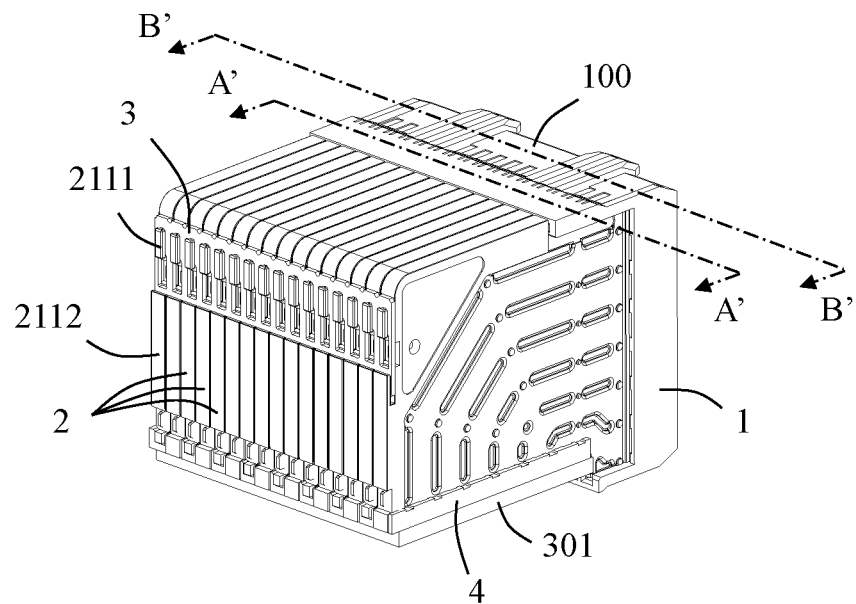
FIG. 3 is a perspective schematic view of a first backplane connector of the present disclosure when it is mounted to a first circuit board.
Figure 4:
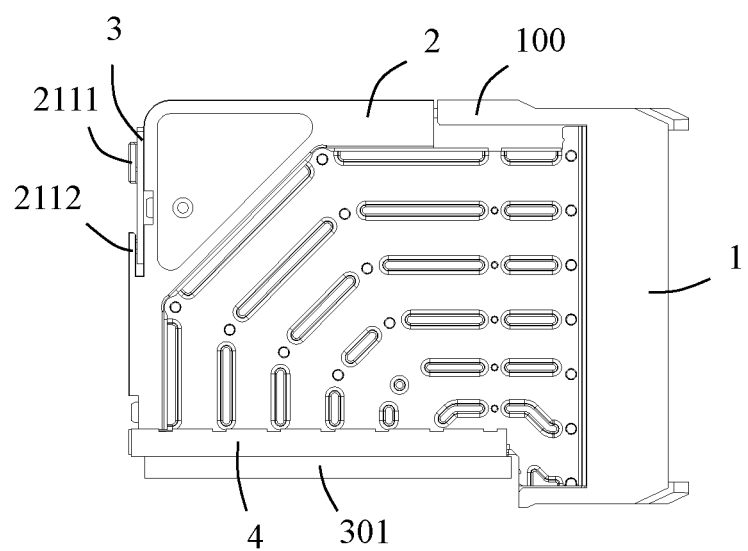
FIG. 4 is a side view of FIG. 3.

Referring to FIGS. 3 and 4, the first backplane connector 100 includes a header 1, a plurality of wafers 2 assembled to the header 1, a spacer 3 fixed at a rear end of the plurality of wafers 2, and a mounting block 4 mounted at a bottom end of the plurality of wafers 2.

Figure 5:
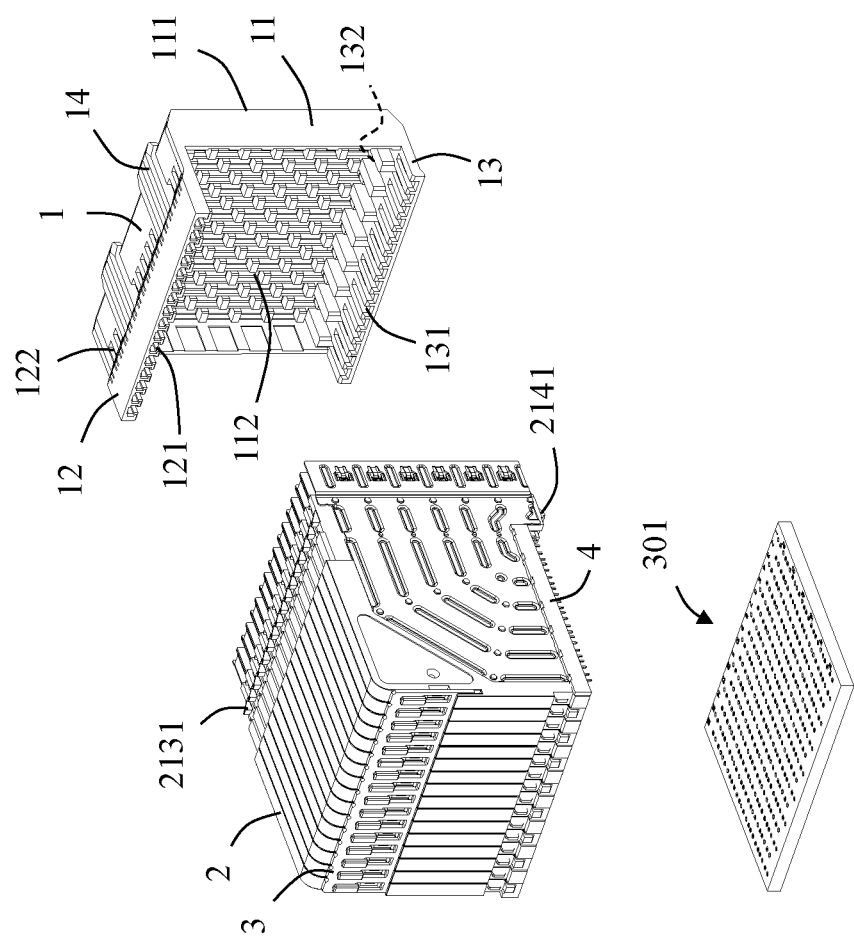
FIG. 5 is a partially exploded perspective view of FIG. 3.
Figure 6:
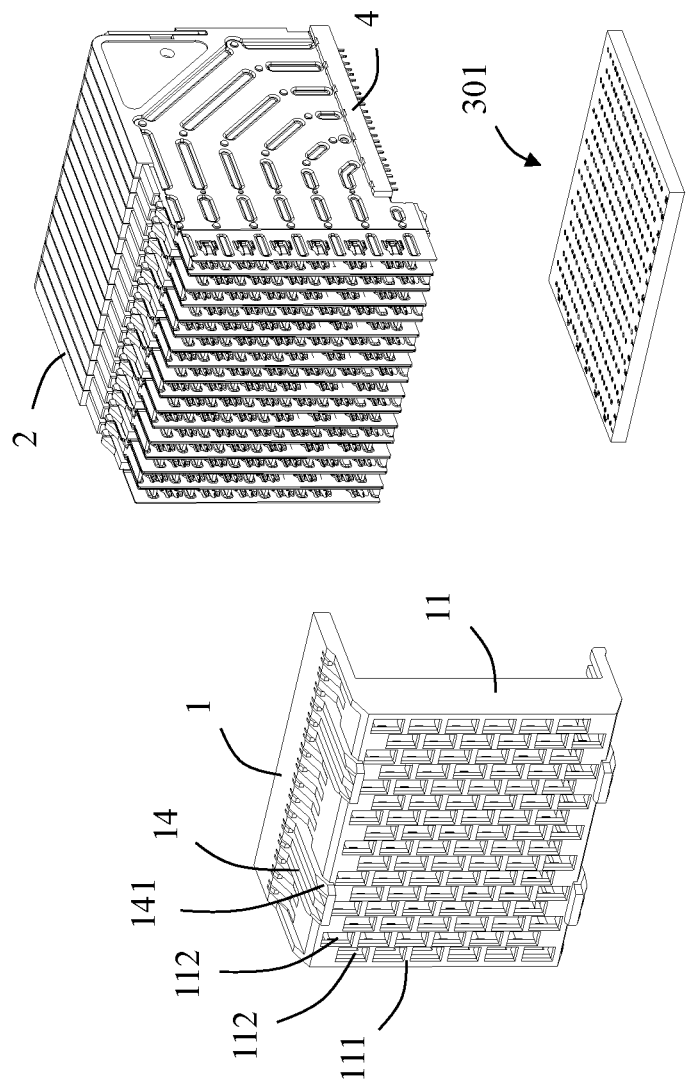
FIG. 6 is a partial perspective exploded view of FIG. 5 from another angle.

Referring to FIGS. 5 and 6, in an embodiment of the present disclosure, the header 1 is made of insulating material. The header 1 includes a body portion 11, a first wall portion 12 extending rearwardly from one side of the body portion 11, and a second wall portion 13 extending rearwardly from the other side of the body portion 11. The first wall portion 12 and the second wall portion 13 are in parallel. The body portion 11 includes a mating surface 111 and a plurality of terminal receiving grooves 112 extending through the mating surface 111. In the illustrated embodiment of the present disclosure, the terminal receiving grooves 112 are disposed in multiple rows along a left-right direction, wherein two adjacent rows of terminal receiving grooves 112 are staggered in a vertical direction. That is, in two adjacent rows of terminal receiving grooves 112, the terminal receiving grooves 112 at corresponding positions are not in alignment in the left-right direction. The first wall portion 12 includes a plurality of first slots 121 and a plurality of first locking grooves 122 communicating with corresponding first slots 121. The second wall portion 13 includes a plurality of second slots 131 and a plurality of second locking grooves 132 communicating with corresponding second slots 131. The first locking grooves 122 and the second locking grooves 132 extend outwardly along the vertical direction through the first wall portion 12 and the second wall portion 13, respectively. The first locking grooves 122 and the second locking grooves 132 are adapted to lock with the wafers 2 in order to prevent the wafers 2 from being separated from the header 1. The first slot 121, the second slot 131 and the terminal receiving grooves 112 which are in alignment with each other along the vertical direction are used to receive the same wafer 2.

Besides, referring to FIG. 6, the header 1 also includes a plurality of positioning protrusions 14 extending forwardly from the first wall portion 12 and the second wall portion 13, respectively. The positioning protrusions 14 protrude beyond the mating surface 111. Each positioning protrusion 14 includes a guiding inclined surface 141 formed at an end thereof.

Figure 7:
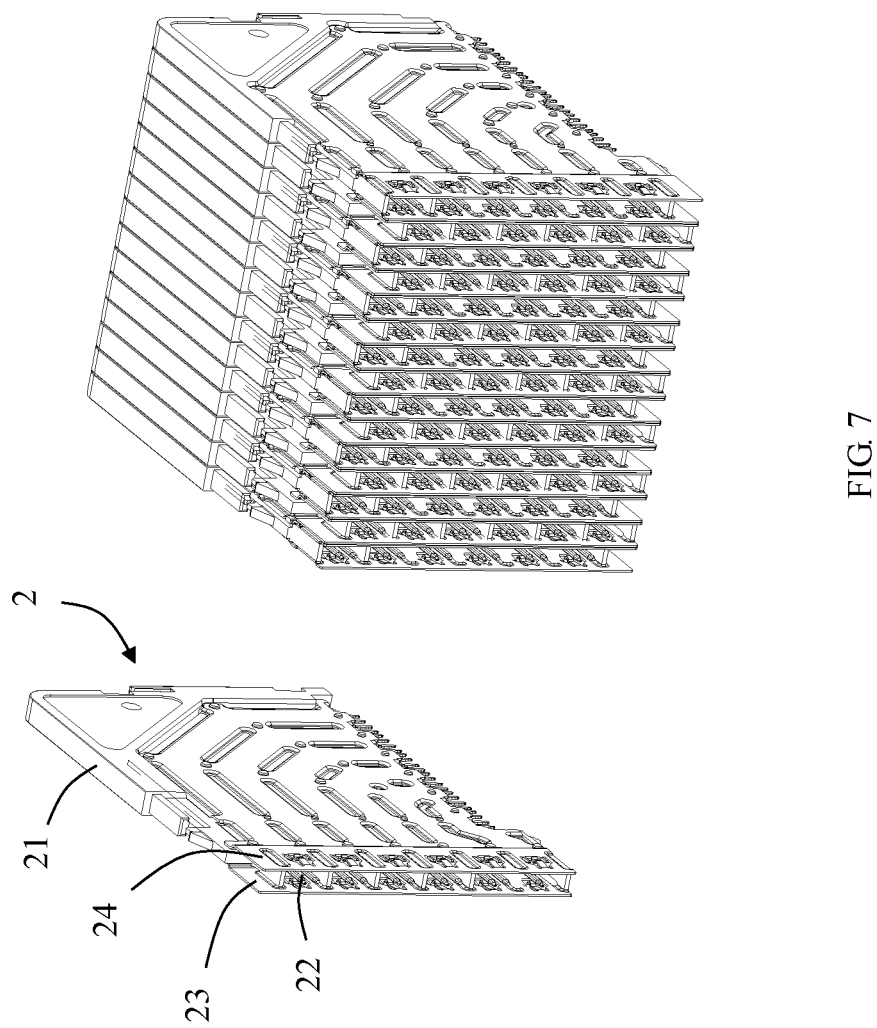
FIG. 7 is a partial perspective exploded view of the first backplane connector of the present disclosure, in which one of the wafers is separated.
Figure 8:
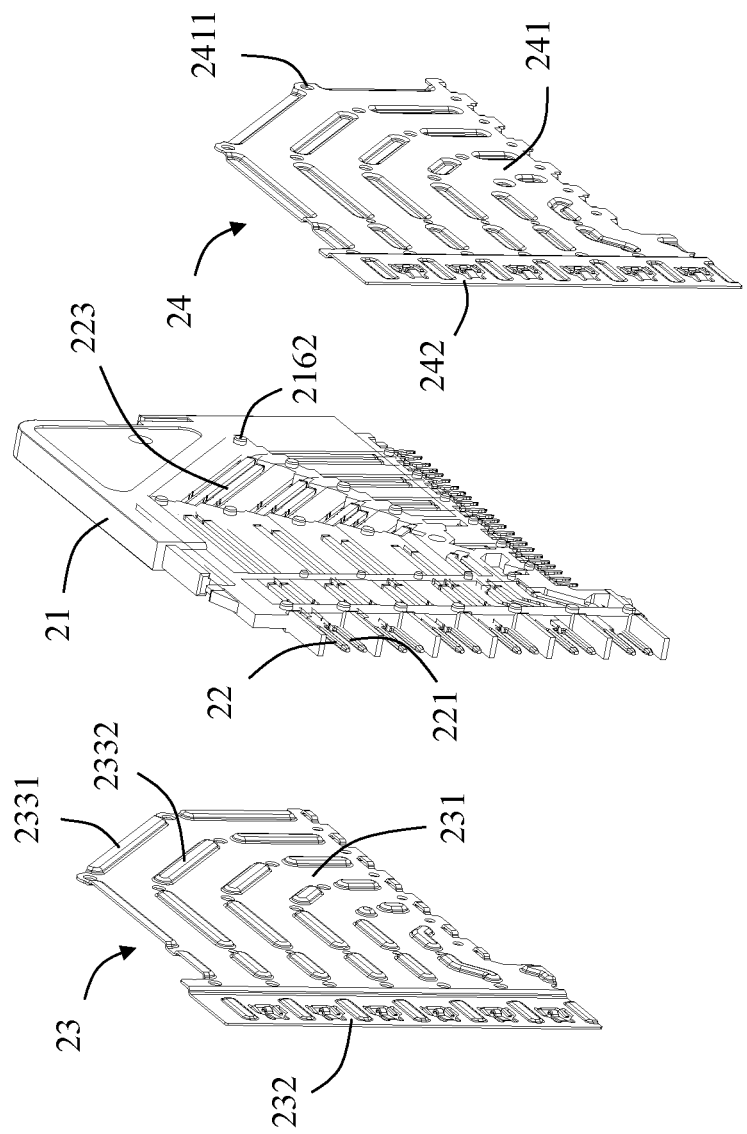
FIG. 8 is a partial perspective exploded view of the wafer in FIG. 7.
Figure 9:
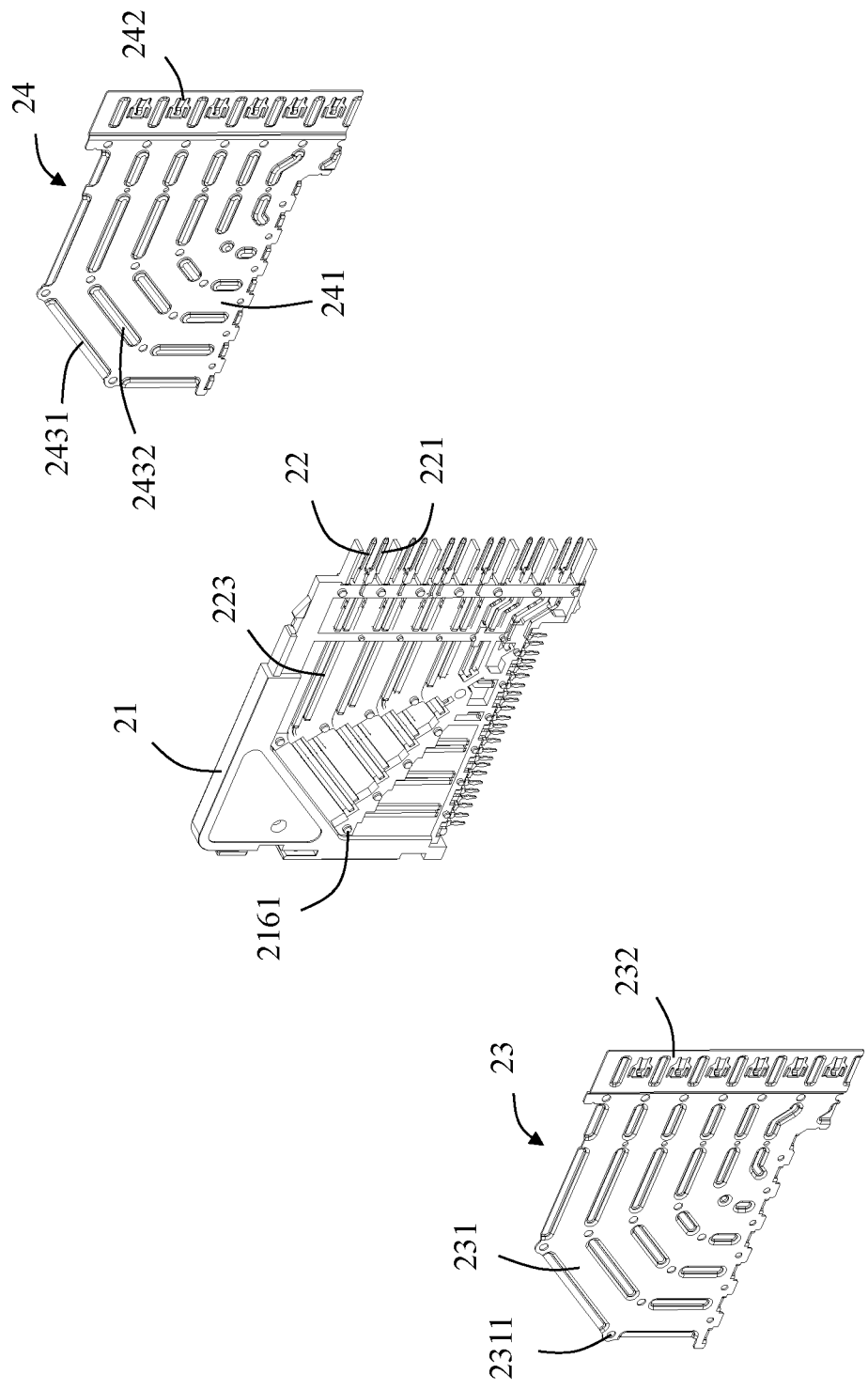
FIG. 9 is a partially exploded perspective view of FIG. 8 from another angle.

Referring to FIGS. 7 to 9, the wafer 2 includes an insulating frame 21, a plurality of conductive terminals 22 fixed to the insulating frame 21, a first metal shield 23 fixed on one side of the insulating frame 21, and a second metal shield 24 fixed on the other side of the insulating frame 21.

Figure 10:
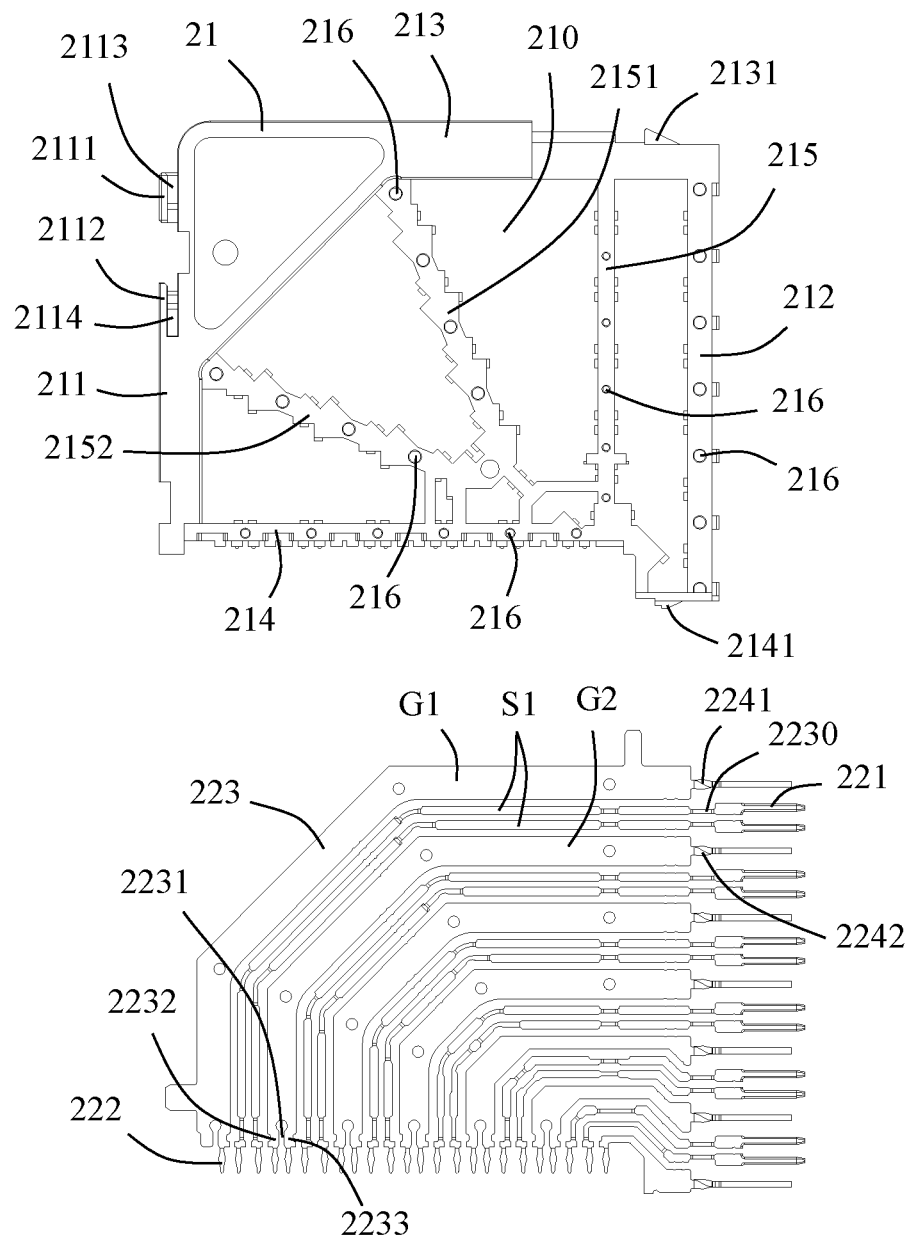
FIG. 10 is a side view of the insulating frame when separated from the conductive terminals.

Referring to FIG. 10, each insulating frame 21 is roughly frame-shaped and includes a rear wall 211, a front wall 212 opposite to the rear wall 211, a top wall 213 connecting one end of the rear wall 211 and one end of the front wall 212, a bottom wall 214 connecting the other end of the rear wall 211 and the other end of the front wall 212, and a plurality of connecting walls 215. The connecting walls 215 are capable of enhancing the structural strength of the frame. The rear wall 211 includes a first protrusion 2111 and a second protrusion 2112 which protrude rearwardly. The first protrusion 2111 and the second protrusion 2112 are spaced apart from each other along the vertical direction. The first protrusion 2111 and the second protrusion 2112 are in alignment with each other along the vertical direction. The first protrusion 2111 includes a first constriction portion 2113, and the second protrusion 2112 includes a second constriction portion 2114. In the illustrated embodiment of the present disclosure, the insulating frame 21 includes a hollow portion 210. The connecting walls 215 include a first connecting wall 2151 connecting the top wall 213 and the bottom wall 214, and a second connecting wall 2152 connecting the rear wall 211 and the bottom wall 214. The first connecting wall 2151 and the second connecting wall 2152 are exposed in the hollow portion 210. The top wall 213 includes a first locking protrusion 2131 for being inserted into the first locking groove 122. The bottom wall 214 includes a second locking protrusion 2141 for being inserted into the second locking groove 132.

The insulating frame 21 further includes a plurality of posts 216 for fixing the first metal shield 23 and the second metal shield 24. In the illustrated embodiment of the present disclosure, the posts 216 are disposed on the bottom wall 214, the first connecting wall 2151, the second connecting wall 2152 and the front wall 212. The first metal shield 23 and the second metal shield 24 are located on opposite sides of the insulating frame 21, respectively. The posts 216 include a plurality of first posts 2161 and a plurality of second posts 2162. The first posts 2161 and the second posts 2162 are located on opposite sides of the insulating frame 21, respectively, so as to be fixed and positioned with the first metal shield 23 and the second metal shield 24.

Referring to FIG. 10, each conductive terminal 22 includes a contact portion 221, a tail portion 222 and a connection portion 223 connecting the contact portion 221 and the tail portion 222. Some of the contact portions 221 are used to electrically connect with the second backplane connector 200. The tail portions 222 are used for being mounted to the first circuit board 301. In the illustrated embodiment of the present disclosure, the contact portion 221 is substantially perpendicular to the tail portion 222. The connection portion 223 is of a curved configuration.

Each group of conductive terminals 22 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 22 are arranged in a manner of G1-S1-S1-G2, which is beneficial to improve the quality of signal transmission. The differential signal terminals are narrow-side coupling or wide-side coupling. A width of the first ground terminal G1 and a width the second ground terminal G2 are greater than a width of each signal terminal S1 which is located between the first ground terminal G1 and the second ground terminal G2. Therefore, it is beneficial to increase the shielding area and improve the shielding effect.

In the illustrated embodiment of the present disclosure, the connection portions 223 of the conductive terminals 22 are partially insert-molded with the insulating frame 21. Each connection portion 223 of the signal terminal S1 has a narrowed portion 2230 insert-molded with the insulating frame 21 so as to adjust the impedance of the signal terminal S1 for achieving impedance matching. In the illustrated embodiment of the present disclosure, the contact portion 221 of the signal terminal S1 is substantially needle-shaped. The contact portion 221 of the first ground terminal G1 and the contact portion 221 of the second ground terminal G2 are substantially rectangular-shaped. The contact portion 221 of the signal terminal S1 and the connection portion 223 of the conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connecting its contact portion 221 and its tail portion 222, so that the contact portion 221 of the first ground terminal G1 is located in a second plane (for example, a vertical plane) perpendicular to the first plane. The second ground terminal G2 includes a second torsion portion 2242 connecting its contact portion 221 and its tail portion 222, so that the contact portion 221 of the second ground terminal G2 is also located in the second plane (for example, the vertical plane) perpendicular to the first plane. The contact portion 221 of the first ground terminal G1 and the contact portion 221 of the second ground terminal G2 are parallel to each other. Each connection portion 223 of the first ground terminals G1 and the second ground terminals G2 further includes a slot 2231 adjacent to its corresponding tail portion 222. The slot 2231 extend through a bottom edge of the connection portion 223, so that the connection portions 223 is divided into a first end portion 2232 and a second end portion 2233.

Figure 11:
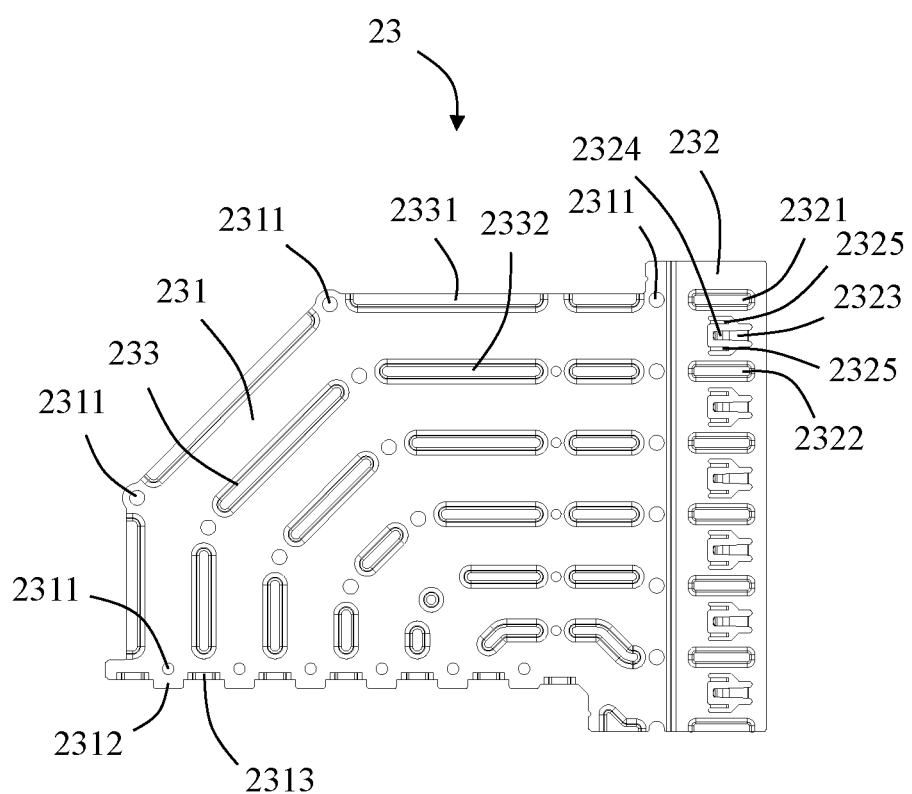
FIG. 11 is a side view of the first metal shield of the first backplane connector.

In the illustrated embodiment of the present disclosure, the first metal shield 23 and the second metal shield 24 are symmetrically disposed on opposite sides of the insulating frame 21. Referring to FIGS. 8, 9 and 11, the first metal shield 23 includes a first main body portion 231 and a first extension portion 232 extending from the first main body portion 231. The first main body portion 231 is located on one side of the connection portions 223 of the conductive terminals 22. The first extension portion 232 is located on one side of the contact portions 221 of the conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the insulating frame 21 are realized. The first main body portion 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the connection portion 223 of the first ground terminal G1. The second ribs 2332 corresponding to the second ground terminal G2 are disposed along an extending direction of the connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the connection portion 223 of the first ground terminal G1 and the extending direction of the connection portion 223 of the second ground terminal G2, respectively, so as to achieve multi-position contact. In order to improve the reliability of the contact between the first metal shield 23 and the first ground terminals G1 and the second ground terminals G2. In the illustrated embodiment of the present disclosure, referring to FIG. 16, a wall thickness of the first rib 2331, a wall thickness of the second rib 2332, and a wall thickness of a portion of the first main body portion 231 located between the first rib 2331 and the second rib 2332 are the same.

The first extension portion 232 includes a plurality of first bulges 2321 protruding toward the corresponding contact portions 221 of the first ground terminals G1, a plurality of second bulges 2322 protruding toward the corresponding contact portions 221 of the second ground terminals G2, and a plurality of first elastic pieces 2323 each of which is located between adjacent first bulge 2321 and adjacent second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent wafer 2 so as to improve the shielding effect. In the illustrated embodiment of the present disclosure, referring to FIG. 18, a wall thickness of the first bulge 2321, a wall thickness of the second bulge 2322 and a wall thickness of a portion of the first extension portion 232 located between the first bulge 2321 and the second bulge 2322 are the same.

In addition, the first main body portion 231 further includes a plurality of first protruding pieces 2312 extending downwardly from a bottom edge thereof and a plurality of connecting pieces 2313 each of which is located between two adjacent first protruding pieces 2312. By providing the first protruding pieces 2312, the shielding length can be extended, and the shielding effect of the signal terminals S1 can be improved. In the illustrated embodiment of the present disclosure, the connecting pieces 2313 are stamped from the first main body portion 231. Each connecting piece 2313 straddles the corresponding slot 2231 to connect one side of the first end portion 2232 and the second end portion 2233 of the same first ground terminal G1, thereby improving the shielding effect. At the same time, each connecting piece 2313 can also connect one side of the first end portion 2232 and the second end portion 2233 of the same second ground terminal G2, thereby improving the shielding effect.

Figure 12:
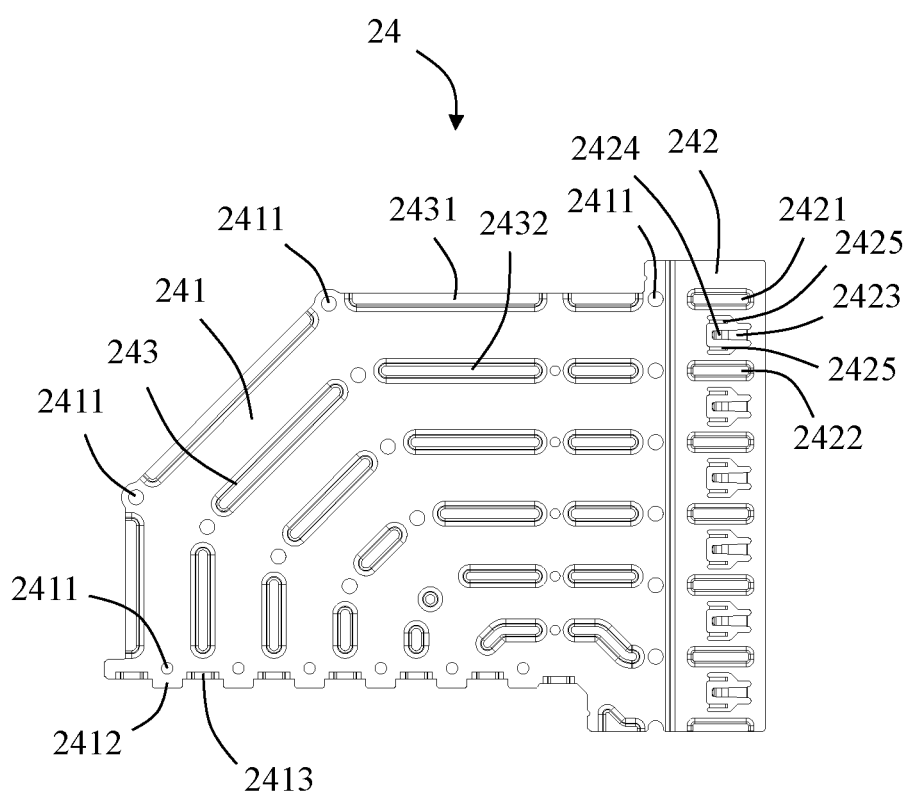
FIG. 12 is a side view of the second metal shield of the first backplane connector.

Similarly, referring to FIGS. 8, 9 and 12, the second metal shield 24 includes a second main body portion 241 and a second extension portion 242 extending from the second main body portion 241. The second main body portion 241 is located on the other side of the connection portions 223 of the conductive terminals 22. The second extension portion 242 is located on the other side of the contact portions 221 of the conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the insulating frame 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the connection portion 223 of the first ground terminal G1. The fourth ribs 2432 are disposed along the extending direction of the connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the connection portion 223 of the first ground terminal G1 and the extending direction of the connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering.

The second extension portion 242 includes a plurality of third bulges 2421 protruding toward the contact portions 221 of the first ground terminals G1, a plurality of fourth bulges 2422 protruding toward the contact portions 221 of the second ground terminals G2, and a plurality of second elastic pieces 2423 each of which is located between adjacent third bulge 2421 and adjacent fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent wafer 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

In addition, the second main body portion 241 further includes a plurality of second protruding pieces 2412 extending downwardly from a bottom edge thereof, and a plurality of connecting pieces 2413 each of which is located between two adjacent second protruding pieces 2412. By providing the second protruding pieces 2412, the shielding length can be extended, and the shielding effect on the signal terminals S1 can be improved. In the illustrated embodiment of the present disclosure, the connecting pieces 2413 are stamped from the second main body portion 241, and the connecting piece 2413 straddles the corresponding slot 2231 so as to connect the other side of the first end portion 2232 and the second end portion 2233 of the same first ground terminal G1 so as to improve the shielding effect. At the same time, the connecting piece 2413 can also connect the other side of the first end portion 2232 and the second end portion 2233 of the same second ground terminal G2 so as to improve the shielding effect.

Figure 13:
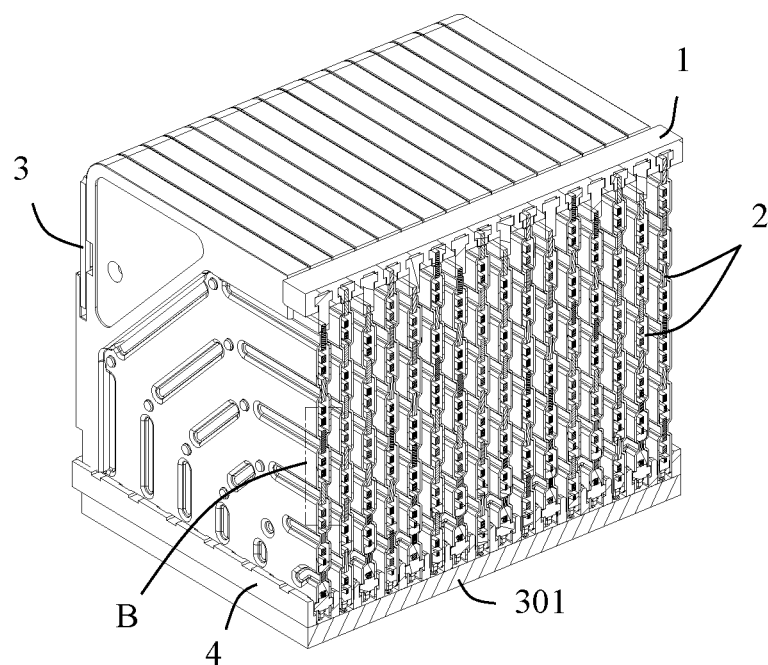
FIG. 13 is a partial perspective cross-sectional view taken along line A'-A' in FIG. 3.
Figure 16:
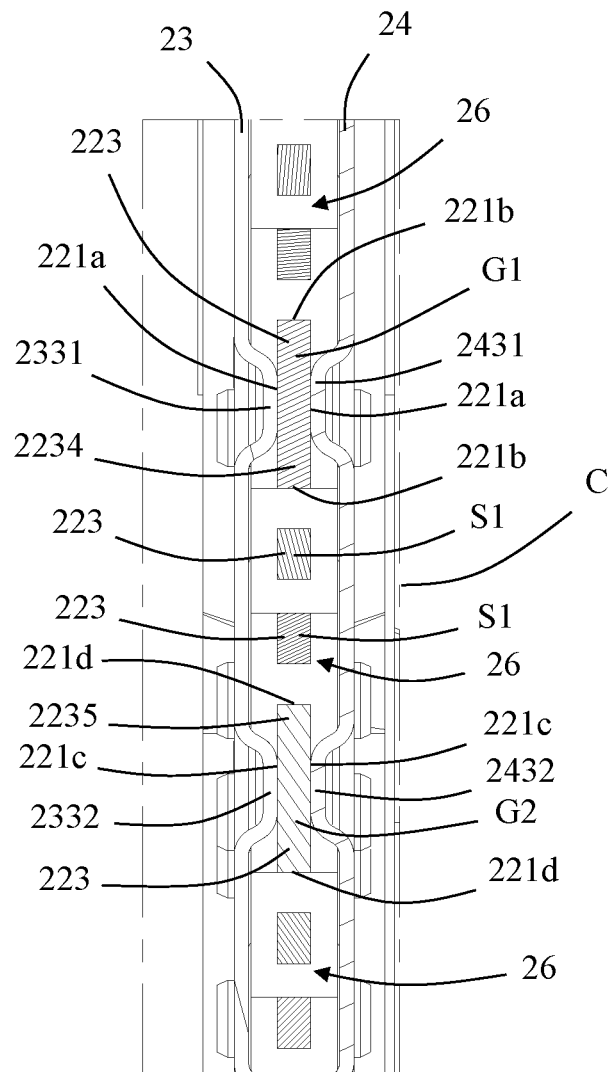
FIG. 16 is a partial enlarged view of a frame part C in FIG. 15.

Referring to FIGS. 13 and 16, in the illustrated embodiment of the present disclosure, the contact portion 221 and the connection portion 223 of the first ground terminal G1 have a first wide surface 221a and a first narrow surface 221b perpendicular to the first wide surface 221a. The contact portion 221 and the connection portion 223 of the second ground terminal G2 have a second wide surface 221c and a second narrow surface 221d perpendicular to the second wide surface 221c. The connection portions 223 of each pair of differential signal terminals are located between the first narrow surface 221b of the first ground terminal G1 and the second narrow surface 221d of the second ground terminal G2 which are located on opposite sides of the connection portions 223 of each pair of differential signal terminals. The contact portions 221 of each pair of differential signal terminals are located between the first wide surface 221a of the first ground terminal G1 and the second wide surface 221c of the second ground terminal G2 which are located on opposite sides of the contact portions 221 of each pair of differential signal terminals. In the illustrated embodiment of the present disclosure, a width of the first wide surface 221a and a width of the second wide surface 221c are greater than a width of each contact portion 221 of the signal terminals S1, thereby better shielding can be provided for the contact portions 221 of the signal terminals S1.

Figure 14:
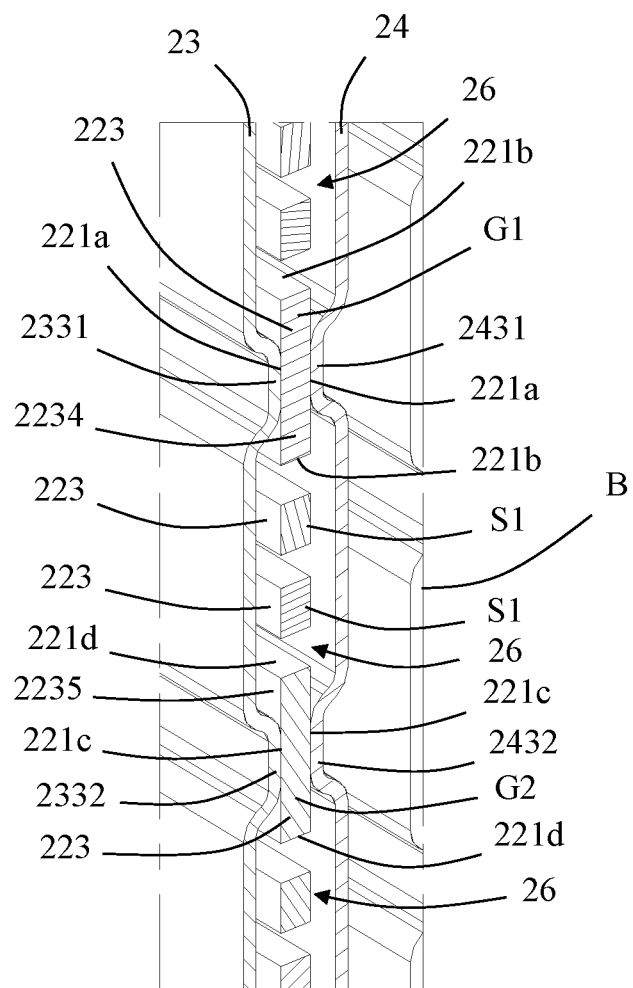
FIG. 14 is a partial enlarged view of a frame part B in FIG. 13.

Referring to FIG. 14, along a length of the connection portion 223 of the conductive terminal 22, the first rib 2331 of the first metal shield 23 and the third rib 2431 of the second metal shield 24 respectively contact two opposite sides of the connection portion 223 of the first ground terminal G1, and the second rib 2332 of the first metal shield 23 and the fourth rib 2432 of the second metal shield 24 respectively contact two opposite sides of the connection portion 223 of the second ground terminal G2, thereby forming a shielding cavity 26 surrounding the outer periphery of the connection portions 223 of each pair of differential signal terminals. In the illustrated embodiment of the present disclosure, the first rib 2331 and the third rib 2431 respectively contact the first wide surface 221a of the connection portion 223 of the first ground terminal G1. The second rib 2332 and the fourth rib 2432 respectively contact the second wide surface 221c of the connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The connection portion 223 of the first ground terminal G1 includes a first tab portion 2234 protruding into the shielding cavity 26. The connection portion 223 of the second ground terminal G2 includes a second tab portion 2235 protruding into the shielding cavity 26. The connection portions 223 of the differential signal terminals are located between the first tab portion 2234 and the second tab portion 2235. In the illustrated embodiment of the present disclosure, there are a plurality of the shielding cavities 26 which are disposed along an arrangement direction of each group of the conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Figure 18:
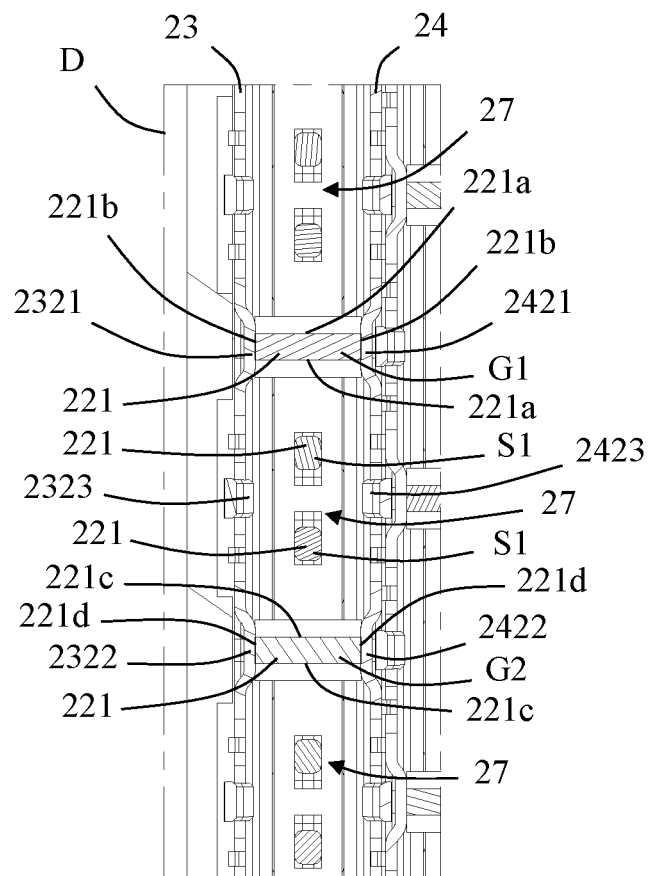
FIG. 18 is a partial enlarged view of a frame part D in FIG. 17.

Referring to FIG. 18, in the length of the contact portion 221 of the conductive terminal 22, the first bulge 2321 of the first metal shield 23 and the third bulge 2421 of the second metal shield 24 respectively contact two opposite side surfaces of the contact portion 221 of the first ground terminal G1, and the second bulge 2322 of the first metal shield 23 and the fourth bulge 2422 of the second metal shield 24 respectively contact two opposite side surfaces of the contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the contact portion 221 of the first ground terminal G1. The second bulge 2322 of the first metal shield 23 and the fourth bulge 2422 of the second metal shield 24 respectively contact the second narrow surfaces 221d of the contact portion 221 of the second ground terminal G2. The first extension portion 232, the second extension portion 242, the first ground terminal G1 and the second ground terminal G2 jointly form a shielding space 27 for accommodating the corresponding contact portions 221 of the differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the conductive terminals 22. Two adjacent shielding spaces 27 share a single first ground terminal G1 or a single second ground terminal G2. One first wide surface 221a of the contact portion 221 of the shared first ground terminal G1 is exposed to the shielding space 27, and the other first wide surface 221a of the contact portion 221 of the shared first ground terminal G1 is exposed to an adjacent shielding space 27. Similarly, a first wide surface 221c of the contact portion 221 of the shared second ground terminal G2 is exposed to the adjacent shielding space 27, and the other wide surface 221c of the contact portion 221 of the shared second ground terminal G2 is exposed to another adjacent shielding space 27.

Figure 15:
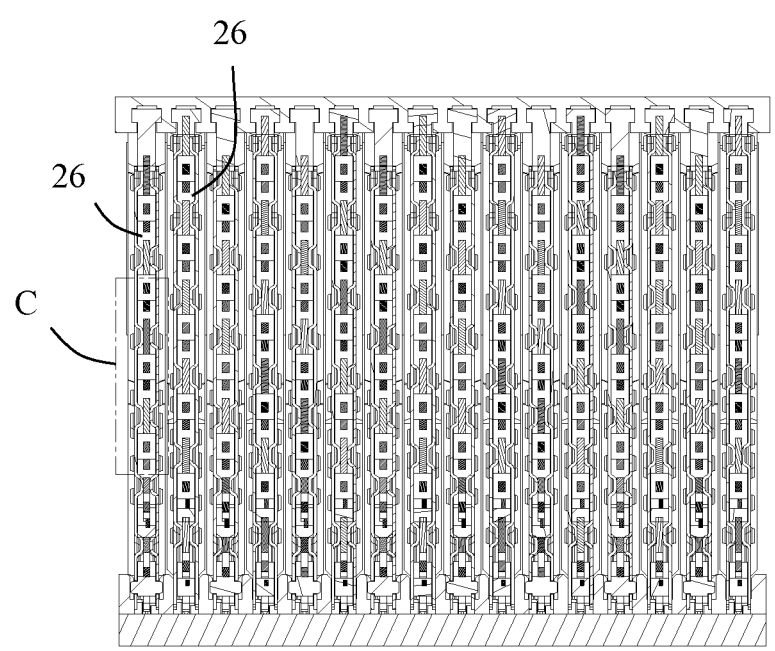
FIG. 15 is a schematic cross-sectional view taken along the line A'-A' in FIG. 3.
Figure 17:
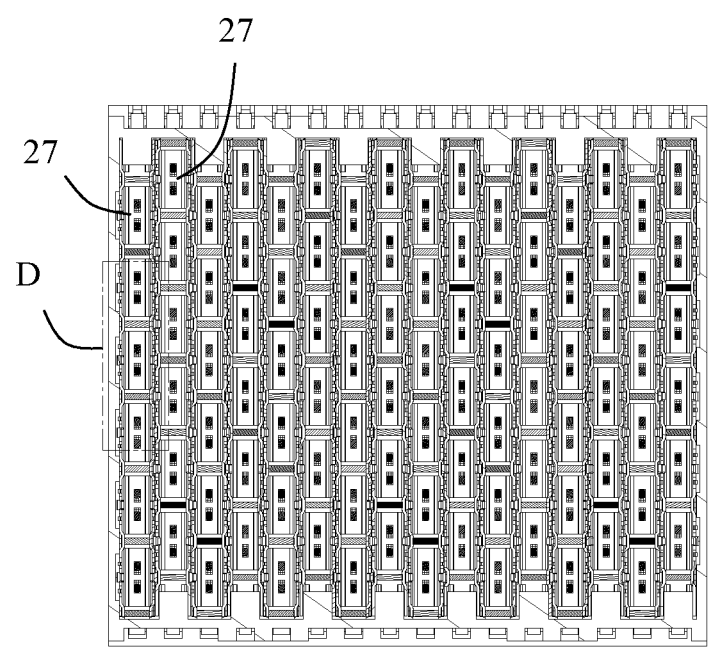
FIG. 17 is a schematic cross-sectional view taken along line B'-B' in FIG. 3.

In the illustrated embodiment of the present disclosure, there are multiple wafers 2 of the first backplane connector 100, and the terminal arrangement of two adjacent wafers 2 are staggered. Correspondingly, the shielding cavities 26 at the same position of two adjacent wafers 2 are staggered (referring to FIG. 15), and the shielding spaces 27 at the same position of two adjacent wafers 2 are staggered (referring to FIG. 17).

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising a wafer, the wafer comprising:
    a plurality of conductive terminals, each conductive terminal comprising a connection portion and a contact portion;
    an insulating frame fixed with the connection portions of the conductive terminals;
    a first metal shield comprising a first extension portion located on one side of the contact portions of the conductive terminals; and
    a second metal shield comprising a second extension portion located on the other opposite side of the contact portions of the conductive terminals;
    wherein the conductive terminals comprise differential signal terminals, a first ground terminal and a second ground terminal, and the differential signal terminals are located between the first ground terminal and the second ground terminal;
    wherein the first extension portion comprises a first bulge protruding toward the first ground terminal and a second bulge protruding toward the second ground terminal;
    wherein the second extension portion comprises a third bulge protruding toward the first ground terminal and a fourth bulge protruding toward the second ground terminal; and
    wherein the first bulge and the third bulge are in contact with two opposite side surfaces of the contact portion of the first ground terminal, respectively; the second bulge and the fourth bulge are in contact two opposite side surfaces of the contact portion of the second ground terminal, respectively; and the first extension portion, the second extension portion, the first ground terminal and the second ground terminal jointly form a shielding space which encloses the contact portions of the differential signal terminals.

2. The backplane connector according to claim 1, wherein the connection portions of the differential signal terminals, the connection portion of the first ground terminal and the connection portion of the second ground terminal are located in a first plane; the first ground terminal comprises a first torsion portion connecting the connection portion of the first ground terminal and the contact portion of the first ground terminal; the second ground terminal comprises a second torsion portion connecting the connection portion of the second ground terminal and the contact portion of the second ground terminal; and the contact portion of the first ground terminal and the contact portion of the second ground terminal are parallel and perpendicular to the first plane.

3. The backplane connector according to claim 2, wherein the contact portion of the first ground terminal comprises two first wide surfaces and two first narrow surfaces, the contact portion of the second ground terminal comprises two second wide surfaces and two second narrow surfaces, the first bulge and the third bulge are in contact with the two first narrow surfaces of the first ground terminal, and the second bulge and the fourth bulge are in contact with the two second narrow surfaces of the second ground terminal, respectively.

4. The backplane connector of claim 1, wherein the first bulge and the second bulge are formed by stamping the first extension portion, and the third bulge and the fourth bulge are formed by stamping the second extension portion.

5. The backplane connector of claim 4, wherein a wall thickness of the first bulge, a wall thickness of the second bulge, and a wall thickness of a portion of the first extension portion located between the first bulge and the second bulge are the same; and
wherein a wall thickness of the third bulge, a wall thickness of the fourth bulge, and a wall thickness of a portion of the second extension portion located between the third bulge and the fourth bulge are the same.

6. The backplane connector according to claim 1, wherein the conductive terminals comprise multiple pairs of differential signal terminals, and each pair of differential signal terminals is located between one first ground terminal and one second ground terminal; and
wherein there are multiple shielding spaces, and two adjacent shielding spaces share one first ground terminal or one second ground terminal.

7. The backplane connector according to claim 1, wherein there are a plurality of wafers, and the shielding spaces at the same position of two adjacent wafers are staggered.

8. The backplane connector of claim 1, wherein the conductive terminals are insert-molded with the insulating frame, and the insulating frame defines a hollow portion in which the connection portions of the conductive terminals are partially exposed; and
wherein each conductive terminal comprises a tail portion connected to the connection portion, and the contact portion and the tail portion extend beyond of the insulating frame.

9. The backplane connector according to claim 1, wherein the first extension portion comprises a first elastic piece located between the first bulge and the second bulge;
wherein the second extension portion comprises a second elastic piece located between the third bulge and the fourth bulge; and
wherein the first elastic piece and the second elastic piece extend into the shielding space.

10. The backplane connector according to claim 9, wherein the first extension portion comprises two first protruding tabs located at opposite ends of the first elastic piece, and the first elastic piece extends along a direction opposite to extending directions of the first protruding tabs;
the second extension portion comprises two second protruding tabs located at opposite ends of the second elastic piece, and the second elastic piece extends along a direction opposite to extending directions of the second protruding tabs; and
wherein the first protruding tabs and the second protruding tabs protrude along directions away from the shielding space in order to contact adjacent wafers.

\* \* \* \* \*